June 20, 1967 S. R. OVSHINSKY 3,327,137
SQUARE WAVE GENERATOR EMPLOYING SYMMETRICAL, JUNCTIONLESS THRESHOLD-SEMICONDUCTOR AND CAPACITOR IN SERIES CIRCUIT DEVOID OF CURRENT LIMITING IMPEDANCES
Filed April 10, 1964
Fig. 1
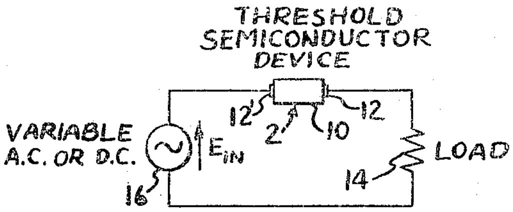
Fig. 2
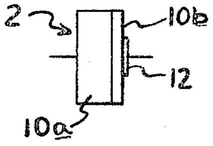
Fig. 2A
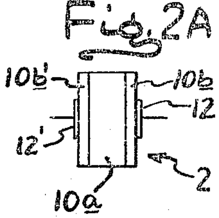
Fig. 2B
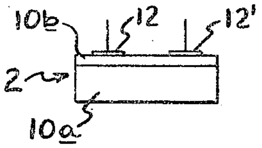
Fig. 3
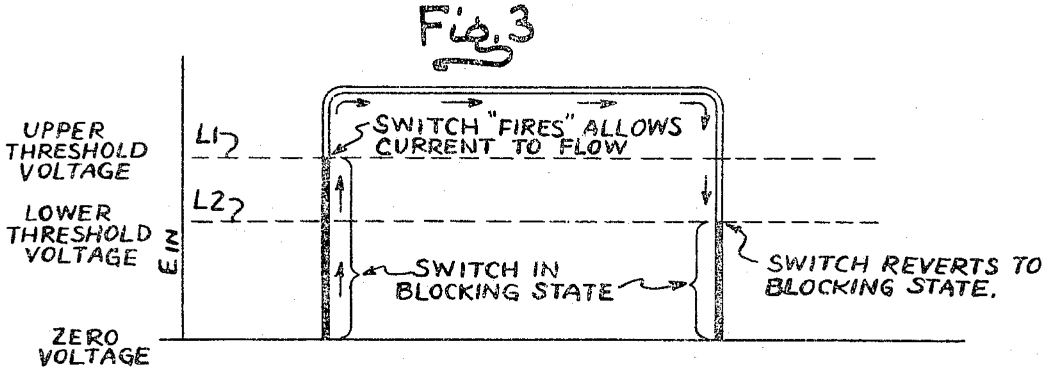
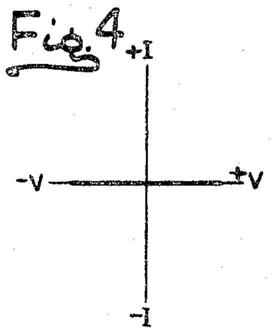
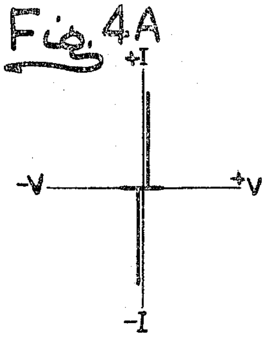
Fig. 5
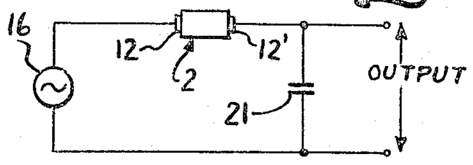
Fig. 6, Fig. 6A
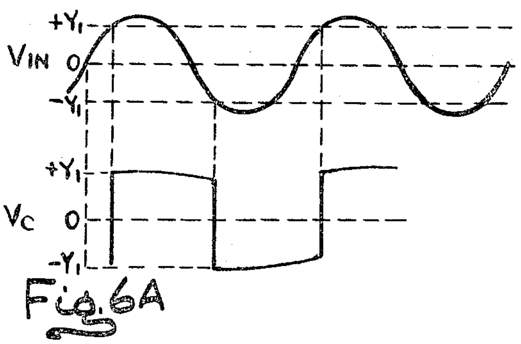
INVENTOR
STANFORD R. OVSHINSKY
by: Wallenstein, Spangenberg & Kattis ATTYS.

United States Patent Office 3,327,137
Patented June 20, 1967

3,327,137

SQUARE WAVE GENERATOR EMPLOYING SYMMETRICAL, JUNCTIONLESS THRESHOLD-SEMICONDUCTOR AND CAPACITOR IN SERIES CIRCUIT DEVOID OF CURRENT LIMITING IMPEDANCES

Stanford R. Ovshinsky, Birmingham, Mich., assignor, by mesne assignments, to Energy Conversion Devices, Inc., Troy, Mich., a corporation of Delaware Filed Apr. 10, 1964, Ser. No. 358,726
4 Claims. (Cl. 307—88.5)

This application is a continuation-in-part of copending applications Ser. No. 118,642 filed June 21, 1961 and abandoned; Ser. No. 226,843 filed Sept. 28, 1962 and forfeited; Ser. No. 252,510 filed Jan. 18, 1963 and abandoned; Ser. No. 252,511 filed Jan. 18, 1963 and forfeited; Ser. No. 252,467 filed Jan. 18, 1963 and abandoned; Ser. No. 288,241 filed June 17, 1963 and abandoned; and Ser. No. 310,407 filed Sept. 20, 1963 now U.S. Patent No. 3,271,591.

This invention relates to voltage generator circuits and more particularly to a square wave generator having an exceedingly simple and inexpensive construction. The present invention makes use of a newly developed bi-directional semiconductor device referred to as a threshold semiconductor device. This device is disclosed in said application Ser. No. 310,407 filed Sept. 20, 1963, and is referred to therein as a "Mechanism Device."

The threshold semiconductor device is a one-layer type semiconductor device having substantially identical conduction characteristics for positive and negative applied voltages. The device initially presents a very high resistance under an applied voltage of any polarity below an upper threshold level and a very low resistance under an applied voltage of any polarity which exceeds an upper threshold level, the change from the high to the low resistance condition occurring substantially instantaneously. The threshold semiconductor device automatically resets itself substantially instantaneously to its high resistance state when the current therethrough drops below a holding current level near zero. By varying the semiconductor composition or the treatment thereof, the upper and lower threshold levels and the blocking or leakage resistance thereof is readily varied. Blocking resistance values of the order of from one to ten megohms and higher are readily obtainable, as well as somewhat lower blocking resistance values.

Perhaps one of the most important characteristics of the threshold semiconductor device making it useful in a square wave generator circuit to be described in the substantially perfect symmetry of its conducting and non-conducting characteristics under an applied voltage of any polarity. Also, it is a very compact device and the cost of manufacturing thereof is exceedingly small.

The square wave generator circuit of the present invention comprises a source of A.C. voltage, which may be a 60 cycle per second voltage from a commercial power system, a threshold semiconductor device and a capacitor connected in mutual series circuit relation. The peak value of the output of the source of A.C. voltage exceeds but is less than twice the upper threshold voltage level of the threshold semiconductor device. Best results are achieved when the threshold semiconductor device has a blocking resistance in the lower range of magnitudes for such devices.

When the instantaneous value of the applied A.C. voltage exceeds the upper threshold level of the threshold semiconductor device, the device will be triggered into its conducting state or condition where the capacitor will charge up substantially instantaneously to the value of the applied voltage at that instant. Current flows through the threshold semiconductor device only momentarily as the capacitor charges to the applied voltage whereupon the device will revert to its blocking state or condition as the current flow drops below the holding current level. As the applied voltage drops below the voltage to which the capacitor is charged in the half cycle involved, the leakage resistance of the threshold semiconductor device will allow the capacitor to discharge a small amount. At some time during the next half cycle the voltage across the capacitor will be in adding relationship to the reversed polarity of the applied voltage and so the resultant voltage across the threshold semiconductor device will again reach the upper threshold level of the device whereupon the device again will be triggered into its conducting state or condition. The operation of the circuit will be stabilized so that the threshold semiconductor device will be fired momentarily once each half cycle of the applied A.C. voltage. The voltage across the capacitor will substantially have a symmetrical square waveform and will have the same frequency as the applied A.C. voltage.

The extreme simplicity and inexpensiveness of the square wave generator circuit just described makes the circuit of the present invention a highly desirable one in comparison to the square wave generator circuits heretofore developed.

For a better understanding of the present invention, reference should now be made to the specification to follow, the claims and the drawings wherein:

FIG. 1 is a schematic representation of the threshold semiconductor device described above in a circuit including a load and a source of voltage for controlling the load;

FIGS. 2, 2A and 2B illustrate a few exemplary physical forms of the threshold semiconductor device shown in FIG. 1;

FIG. 3 is a diagram illustrating the operation of the threshold semiconductor device in FIG. 1;

FIGS. 4 and 4A illustrate the voltage current characteristics for the two operating states of the threshold semiconductor device of FIG. 1 in an A.C. load circuit;

FIG. 5 is a circuit diagram of a square wave generator circuit of the present invention; and FIGS. 6 and 6A show respectively the applied voltage and the output voltage of the square wave generator shown in FIG. 5.

For an understanding of the construction and mode of operation of the threshold semiconductor device, reference should now be made to FIGS. 1 through 4A. FIG. 1 illustrates a typical simple load circuit for a threshold semiconductor device used in the present invention. The device has a body 10 which may take a variety of forms and includes as a surface film or as an entire body or as a part thereof, an active bi-directional semiconductor material having very unique and advantageous properties to be described. The body 10 has a pair of electrodes 12–12' electrically connecting the same with a load 14 and a source of voltage 16. In the present invention the source of voltage 16 will be a source of A.C. voltage which may have a sinusoidal waveform. The load 14 is illustrated in FIG. 1 as a resistance and the operation of the threshold semiconductor device will first be described having such a resistive load. (In the invention the load is a capacitor which modifies the operation of the threshold semiconductor device. An understanding of the operation of the threshold semiconductor device, however, can be more simply understood by initially considering the device in a circuit with a resistive load.)

The threshold semiconductor device is symmetrical in its operation and contains non-rectifying active solid state semiconductor materials and electrodes in non-rectifying contact therewith for controlling the current flow therethrough substantially equally in either or both directions. In their high resistance or blocking conditions these materials may be crystalline like materials or, preferably, materials of the polymeric type including polymeric networks and the like having covalent bonding and cross linking highly resistant to crystallization, which are in a locally organized disordered solid state condition which is generally amorphous (not crystalline) but which may possibly contain relatively small crystals or chains or ring segments which would probably be maintained in randomly oriented position therein by the cross linking. These polymeric structures may be one, two or three dimensional structures. While many different materials may be utilized, for example, these materials acn be tellurides, selenides, sulfides or oxides of substantially any metal, or metalloid, or intermetallic compound, or semiconductor or solid solutions or mixtures thereof, particularly good results being obtained where tellurium or selenium are utilized.

It is believed that the cooperating materials (metals, metalloids, intermetallic compounds or semiconductors), which may form compounds, or solid solutions or mixtures with the other materials in the solid state semiconductor materials operate, or have a strong tendency to operate, to inhibit crystallization in the semiconductor materials, and it is believed that this crystallization inhibiting tendency is particularly pronounced where the percentages of the materials are relatively remote from the stoichiometric and eutectic ratios of the materials, and/or where the materials themselves have strong crystal inhibiting characteristics, such as, for example, arsenic, gallium and the like. As a result, where, as here, the semiconductor materials have strong crystallization inhibiting characteristics, they will remain in or revert to their disordered or generally amorphous state.

The following are specific examples of some of the semiconductor materials which have given satisfactory results in a threshold semiconductor device (the percentages being by weight):

25% arsenic and 75% of a mixture 90% tellurium and 10% germanium; also, with the addition of 5% silicon;
75% tellurium and 25% arsenic;
71.8% tellurium, 14.05% arsenic, 13.06% gallium and the remainder lead sulfide;
72.6% tellurium, 17.2% arsenic and 13.2% gallium;
72.6% tellurium, 27.4% gallium arsenide;
85% tellurium, 12% germanium and 3% silicon;
50% tellurium, 50% gallium;
67.2% tellurium, 25.3% gallium arsenide and 7.5% n-type germanium;
75% tellurium and 25% silicon;
75% tellurium and 25% indium antimonide;
55% tellurium and 45% germanium;
45% tellurium and 55% germanium;
75% selenium and 25% arsenic;
50% aluminum telluride and 50% gallium telluride; and
50% aluminum telluride and 50% indium telluride In forming the solid state semiconductor materials, the host and cooperating materials may be ground in an unglazed porcelain mortar to an even powder consistency and thoroughly mixed. They then may be brazed in a sealed quartz tube to above the melting point of the material which has the highest melting point. The molten materials may be cooled in the tube and then broken or cut into pieces, with the pieces ground to proper shape to form the bodies 10, or the molten materials may be cast from the tube into preheated graphite molds to form the bodies. The initial grinding of the materials may be done in the presence of air or in the absence of air, the former being preferable where considerable oxides are desired in the ultimate bodies 10. Alternatively, in forming the bodies 10, it may be desirable to press the mixed powdered materials under pressures up to at least 1000 p.s.i. until the powdered materials are completely compacted, and then the completely compacted materials may be appropriately heated.

In some instances it has been found, particularly where arsenic is present in the bodies 10 formed in the foregoing manner, that the bodies are in a disordered or generally amorpous solid state or condition, the high resistance or blocking state. In such instances, bare electrodes can be and have been embedded in the bodies during the formation thereof, and can be and have been applied to the surfaces thereof, to provide threshold semiconductor devices wherein the control of the electric current is accomplished in the bulk of the solid state semiconductor materials.

In other instances, it has been found that the bodies 10 formed in the foregoing manner are in a crystalline like solid state, which may be a resistance or conducting state or condition, probably due to the slow cooling of the semiconductor materials during the formation of the bodies. In these instances, it is necessary to change the bodies or the surfaces thereof to a disordered or generally amorphous state, and this may be accomplished in various ways, as for example: utilizing impure materials, adding impurities; including oxides in the bulk and/or in the surfaces or interfaces; mechanically by machining, sand blasting, impacting, bending, etching or subjecting to ultrasonic waves; metallurgically forming physical lattice deformations by heat treating and quick quenching or by high energy radiation with alpha, beta or gamma rays; chemically by means of oxygen, nitric or hydrofluoric acid, chlorine, sulphur, carbon, gold, nickel, iron or manganese inclusions, or ionic composition inclusions comprising alkali or alkaline earth metal compositions; electrically by electrical pulsing; or combinations thereof.

Where the entire bodies are changed in any of the foregoing manners to their disordered or generally amorphous solid state, bare electrodes may be embedded therein during the formation of the bodies and the current control by such solid state current controlling devices would be in the bulk. Another manner of obtaining current control in the bulk is to embed in the bodies electrodes which, except for their tips, are provided with electrical insulation, such as an oxide of the electrode material. Current pulses are then applied to the electrodes to cause the effective semiconductor material between the uninsulated tips of the electrodes to assume the disordered or generally amorphous solid state.

The control of current by the threshold semiconductor devices can also be accomplished by surfaces or films of the semiconductor materials, particularly good results being here obtained. Here, the bodies of the semiconductor material, which are in a low resistance crystalline like solid state, may have their surfaces treated in the foregoing manners to provide surfaces or films which are in their disordered or generally amorphous solid state. Electrodes are suitably applied to the surfaces or films of such treated bodies, and since the bulk of the bodies is in the crystalline like solid state and the surfaces or films are in a disorganized or generally amorphous state (high resistance or substantially an insulator), the control of the current between the electrodes is mainly accomplished by the surfaces or films.

Instead of forming the complete body 10, the foregoing solid state semiconductor materials may be coated on a suitable smooth substrate, which may be a conductor or an insulator as by vacuum deposition or the like, to provide surfaces or films of the semiconductor material on the substrate which surfaces or films are in a disordered or generally amorphous solid state (high resistance or substantially an insulator). The solid state semiconductor materials normally assume this state probably because of rapid cooling of the materials as they are deposited or they may be readily made to assume such state in the manners described above. Electrodes are suitably applied to the surfaces or films on the substrate and the control of the current is accomplished by the surfaces or films. If the substrate is a conductor, the control of the current is through the surfaces or films between the electrodes and the substrate, and, if desired, the substrate itself may form an electrode. If the substrate is an insulator, the control of the current is along the surfaces or films between the electrodes. A particularly satisfactory device which is extremely accurate and repeatable in production has been produced by vapor depositing on a smooth substrate a thin film of tellurium, arsenic and germanium and by applying tungsten electrodes to the deposited film. The film may be formed by depositing these materials at the same time to provide a uniform and fixed film, or the film may be formed by depositing in sequence layers of tellurium, arsenic, germanium, arsenic and tellurium, and in the latter case, the depositioned layers are then heated to a temperature below the sublimation point of the arsenic to unify and fix the film. The thickness of the surfaces or films, whether formed on the bodies by suitable treatment thereof or by deposition on substrates may be in a range up to a thickness of a few ten thousandths of an inch or even up to a thickness of a few hundredths of an inch or more.

The electrodes which are utilized in the threshold semiconductor devices used in this invention may be substantially any good electrical conductor, preferably high melting point materials, such as tantalum, graphite, tungsten, niobium and molybdenum. These electrodes are usually relatively inert with respect to the various aforementioned semiconductor materials.

The electrodes when not embedded in the bodies 10 in the instances discussed above, may be applied to the surfaces or films of bodies, or to the surfaces or films deposited on the substrates in any desired manner, as by mechanically pressing them in place, by fusing them in place, by soldering them in place, by vapor deposition or the like. Preferably, after the electrodes are applied, a pulse of voltage and current is applied to the devices for conditioning and fixing the electrical contact between the electrodes and the semiconductor materials. The current controlling devices may be encapsulated if desired.

It is believed that the generally amorphous polymeric like semiconductor materials have substantial current carrier restraining centers and a relatively large energy gap, that they have a relatively small mean free path for the current carriers, large spacial potential fluctuations and relatively few free current carriers due to the amorphous structure and the current carrier restaining centers therein for providing the high resistance or blocking state or condition. It is also believed that the crystalline like materials in their high resistance or blocking state or condition have substantial current carrier restraining centers, and have a relatively large mean free path for the current carriers due to the crystal lattice structure and hence a relatively high current carrier mobility but that there are relatively few free current carriers due to the substantial current carrier restraining centers therein, a relatively large energy gap therein, and large spatial potential fluctuations therein for providing the high resistance or blocking state or condition. It is further believed that the amorphous type semiconductor materials may have a higher resistance at the ordinary and usual temperatures of use, a greater non-linear negative temperature-resistance coefficient, a lower heat conductivity coefficient, and a greater change in electrical conductivity between the blocking state or condition and the conducting state or condition than the crystalline type of semiconductor materials, and thus be more suitable for many applications of this invention. By appropriate selection of materials and dimensions, the high resistance values may be predetermined and they may be made to run into millions of ohms, if desired.

As an electrical field is applied to the semiconductor material (either the crystalling type or the amorphous type) of a device of this invention in its blocking state or condition, such as a voltage applied to the electrodes, the resistance of at least portions or paths of the semiconductor material between the electrodes decreases gradually and slowly as the applied field increases until such time as the applied field or voltage increases to a threshold value, whereupon said at least portions of the semiconductor material, at least one path between the electrodes, are substantially instantaneously changed to a low resistance or conducting state or condition for conducting current therethrough. It is believed that the applied threshold field or voltage causes firing or breakdown or "switching" of said at least portions or paths of the semiconductor material, and that the breakdown may be electrical or thermal or a combination of both, the electrical breakdown caused by the electrical field or voltage being more pronounced where the distance between the electrodes is small, as small as a fraction of a micron or so, and the thermal breakdown caused by the electrical field or voltage being more pronounced for greater distances between the electrodes. For some crystalline like materials the distances between the electrodes can be so small that barrier rectification and p-n junction operation are impossible due to the distances being beneath the transition length or barrier height. The "switching" time for switching from the blocking state to the conducting state are extremely short, less than a few microseconds.

The electrical breakdown may be due to rapid release, multiplication and conduction of current carriers in avalanche fashion under the influence of the applied electrical field or voltage, which may result from external field emission, internal field emission, impact or collision ionization from current carrier restraining centers (traps, recombination centers or the like), impact or collision ionization from valence bands, much like that occurring at breakdown in a gaseous discharge tube, or by lowering the height or decreasing the width of possible potential barriers and tunneling or the like may also be possible. It is believed that the local organization of the atoms and their spatial relationship in the crystal lattices in the crystalline type materials and the local organization and the spatial relationship between the atoms or small crystals or chain or ring segments in the amorphous type materials, at breakdown, are such as to provide at least a minimum mean free path for the current carriers released by the electrical field or voltage which is sufficient to allow adequate acceleration of the free current carriers by the applied electrical field or voltage to provide the impact or collision ionization and electrical breakdown. It is also believed that such a minimum mean free path for the current carriers may be inherently present in the amorphous structure and that the current conducting condition is greatly dependent upon the local organization for both the amorphous and crystalline conditions. As expressed above a relatively large mean free path for the current carriers can be present in the crystalline structure.

The thermal breakdown may be due to Joule heating of said at least portions or paths of the semiconductor material by the applied electrical field or voltage, the semiconductor material having a substantial non-linear negative temperature-resistance coefficient and a minimal heat conductivity coefficient, and the resistance of said at least portions or paths of the semiconductor material rapidly decreasing upon such heating thereof. In this respect, it is believed that such decrease in resistance increases the current and rapidly heats by Joule heating said at least portions or paths of the semiconductor material to thermally release the current carriers to be accelerated in the mean free path by the applied electrical field or voltage to provide for rapid release, multiplication and conduction of current carriers in avalanche fashion and, hence, breakdown, and, especially in the amorphous condition, the overlapping of orbitals by virtue of the type of local organization can create different sub-bands in the band structure.

It is also believed that the current so initiated between the electrodes at breakdown (electrically, thermally or both) causes at least portions or paths of the semiconductor material between the electrodes to be substantially instantaneously heated by Joule heat, that at such increased temperatures and under the influence of the electrical field or voltage, further current carriers are released, multiplied and conducted in avalanche fashion to provide high current density, and a low resistance or conducting state or condition which remains at a greatly reduced applied voltage. It is possible that the increase in mobility of the current carriers at higher temperature and higher electric field strength is due to the fact that the current carriers being excited to higher energy states populate bands of lower effective mass and, hence, higher mobility than at lower temperatures and electric field strengths. The possibility for tunneling increases with lower effective mass and higher mobility. It is also possible that a space charge can be established due to the possibility of the current carriers having different masses and mobilities and since an inhomogeneous electric field could be established which would continuously elevate current carriers from one mobility to another in a regenerative fashion. As the current densities of the devices decrease, the current carrier mobilities decrease and, therefore, their capture possibilities increase. In the conducting state or condition the current carriers would be more energetic than their surroundings and would be considered as being hot. It is not clear at what point the minority carriers present could have an influence on the conducting process, but there is a possibility that they may enter and dominate, i.e. become majority carriers at certain critical levels.

It is further believed that the amount of increase in the mean free path for the current carriers in the amorphous like semiconductor material and the increased current carrier mobility are dependent upon the amount of increase in temperature and field strength, and it is possible that said at least portions or paths of some of the amorphous like semiconductor materials are electrically activated and heated to at least a critical transition temperature, such as a glass transition temperature, where softening begins to take place. Thus, due to such increases in mean free path for the current carriers, the current carriers produced and released by the applied electical field or voltage are rapidly released, multiplied and conducted in avalanche fashion under the influence of the applied electrical field or voltage to provide and maintain a low resistance or conducting state or condition.

The voltage across the device in its low resistance or conducting state or condition remains substantially constant although the current may increase and decrease greatly. In this connection, it is believed that the conducting filaments or threads or paths between the electrodes increase and decrease in cross section as the current increases and decreases for providing the substantially constant voltage condition while conducting. When the current through said at least portions or paths of the semiconductor material decreases to a minimum current holding value which is near zero, it is believed that there is insufficient current to maintain the same in their low resistance or conducting state or condition, whereupon they substantially instantaeously change or revert to their high resistance or blocking state or condition. In other words, the conducting filaments or threads or paths between the electrodes are interrupted when this condition occurs. The decrease in current below the minimum current holding value may be brought about by decreasing the applied voltage to a low value. Said at least portions or paths of the semiconductor material may again be substantially instantaneously changed to their low resistance or conducting state or condition when they are again activated by the voltage applied thereto. The ratio of the blocking resistance to the resistance in the conducting state or condition is extremely high, as for example, larger than 100,000:1. In its low resistance or conducting state or condition the resistance may be as low as 1 ohm or less as determined by the small voltage drop thereacross and the holding current for the device may be near zero.

The voltage-current characteristics of the current controlling device are reversible and are generally independent of the load resistance and independent of whether D.C. or A.C. is used. The manner in which the current controlling device operates in a load circuit powered by an A.C. voltage (FIG. 1) is illustrated by the diagram of FIG. 3 and by the voltage-current curves of FIGS. 4 and 4A. When the device 2 is in its high resistance or blocking state or condition and the applied A.C. voltage is less than the threshold or breakdown voltage value of the device, the device remains in its high resistance or blocking state or condition as indicated in FIGS. 3 and 4. When the peak or RMS value of the A.C. applied voltage is raised to at least the breakdown or upper threshold voltage level L1 shown in FIG. 3 (the actual voltage value will obviously be different in the two cases), the device fires and causes said at least portions or paths of the semiconductor material to switch or change to the low resistance or conducting state or condition as indicated in FIGS. 3 and 4A. It is noted that the vertical portions of the curve in FIG. 4A are slightly off-set from the zero voltage center point which curve portions represent the small resistance of the device 2 and the small and substantially constant voltage drop thereacross in its low resistance or conducting state or condition. In this condition there is a constant ratio of voltage change to current change in the device 2, the voltage drop thereacross is a minor fraction of the voltage drop across the active semiconductive material of the device in the blocking condition thereof and the low voltage drop thereacross in the conducting condition of the device is the same for increase and decrease in the instantaneous current above the minimum current holding value. It is also noted in FIG. 4A that the device intermittently assumes its high resistance or blocking state or condition each half cycle of the A.C. voltage as the instantaneous voltage nears zero and drops the current below the minimum current holding value, the current being momentarily interrupted during each half cycle. However, following each momentary half cycle interruption of the current flow, the low resistance state or condition of said at least portions or paths of the semiconductor material resumes the next half cycle when the applied voltage reaches a certain level L2 in FIG. 3 which may be substantially below the upper threshold voltage level if the active semiconductor material has any appreciable thickness where heat dissipation is less than ideal. This lower voltage level is referred to in FIG. 3 as lower threshold voltage value or level. The semiconductor device is considered to be in its conducting state or condition despite its momentary return to the high resistance state or condition each half cycle. However, when the RMS or peak value of the A.C. voltage is decreased below the lower threshold voltage level L1, the low resistance state or condition does not resume each half cycle and the device is then considered to be in the blocking state or condition, this being illustrated in FIGS. 3 and 4. After the device becomes nonconducting, it cannot again become conducting until the RMS or peak voltage of the applied A.C. voltage becomes at least as great as the upper threshold voltage value L1 of the device to produce the voltage-current curve of FIG. 4A.

FIGS. 2, 2A and 2B illustrate some exemplary physical forms of the threshold semiconductor device 2. They comprise an inactive and conducting body portion **10*a* of metal or the like or an inactive and conducting semiconductor material and one or more active semiconductor layers or films 10*b*–10*b′* made in the manner described above. The electrodes 12 and 12′ may comprise separate layers of metal or the like as illustrated in the embodiments of FIGS. 2A and 2B or one of the electrodes 12** may be formed by the conductive body portion 10a as illustrated in the embodiment of FIG. 2.

Refer now to FIG. 5 which illustrates the application of the threshold semiconductor device 2 just described in the square wave generator circuit of the present invention. As previously indicated, the circuit comprises a source of A.C. voltage 16 which has an output which is a continuous sine wave as shown in FIG. 6, a threshold semiconductor device 2 and a capacitor 21 connected in mutual series circuit relation. The output of the square wave generator circuit (FIG. 6A) is taken across the capacitor. The peak value of the output of the source of A.C. voltage 16 is adjusted to exceed the upper threshold voltage level of the device 2, but it must not exceed twice the upper threshold voltage level of the device 2.

When the applied A.C. voltage instantaneously exceeds the upper threshold voltage level of the device 2, the state of the device changes from its blocking to its conducting state or condition for reasons previously explained. It is assumed that the time constant of the charge circuit for the capacitor 21 is so small that the capacitor substantially charges instantaneously to the voltage level which triggered the device 2 to its conducting state.

In FIG. 6, the positive and negative voltage levels Y1 represent the net applied voltage across the terminals 12 and 12' of the threshold semiconductor device 2. This net voltage comprises the output of the source of A.C. voltage 16 and the voltage to which the capacitor 21 is charged at the instant involved. At the instant the capacitor 21 charges to the input voltage, the resultant voltage across the terminals of the threshold semiconductor device 2 is zero. A momentary current pulse will flow in the circuit during the time the capacitor 21 is charging, and thereafter the device 2 will revert to its blocking state or condition because the current will have dropped to zero.

During the remainder of the half cycle involved following the firing of the threshold semiconductor device 2, the device remains in its blocking state or condition. As the instantaneous value of the output of the source A.C. voltage 16 goes below the voltage to which the capacitor 21 is charged, the latter will tend to discharge somewhat depending upon the blocking resistance of the threshold semiconductor device 2. In any event, the resultant voltage applied across the terminals 12–12' of the threshold semiconductor device 2 will not reach the (reverse) upper voltage threshold level until some time during the succeeding half cycle. The operation of the circuit will stabilize under conditions wherein the threshold semiconductor device 2 will be triggered into its conducting state only once each half cycle as illustrated in FIG. 6A. The voltage across the capacitor 21 will have a generally square waveform with steep leading and trailing edges.

It should be understood that numerous modifications may be made in a particular composition or physical configuration of the threshold semiconductor device 2 without departing from the spirit of the present invention.

I claim:

1. A generator circuit comprising: a series circuit comprising a source of gradually varying A.C. voltage, a capacitor and a bi-directional threshold semiconductor device connected in series circuit relation, said threshold semiconductor device having a pair of load terminals connecting the device into the series circuit, said threshold semiconductor device including a solid state semiconductor material having one condition wherein at least portions thereof between the load terminals are in one condition which is of high resistance and substantially an insulator for blocking the flow of current therethrough in either or both directions when the peak value of an applied voltage is below an upper threshold voltage level, and being driven into another condition wherein said at least portions thereof between the load terminals are in another condition which is of low resistance and substantially a conductor for conducting the flow of current therethrough substantially equally in either or both directions when the peak value of the applied voltage is raised above said upper threshold voltage level, and reverts to said blocking condition when the current flow therethrough drops to zero, the peak value of said source of voltage being at or above the upper threshold voltage level of said threshold semiconductor device, said series circuit being devoid of effective current limiting impedances so the time constant of the series circuit is sufficiently short that the capacitor substantially instantaneously charges to the output of said source of voltage as it reaches a value which provides, in conjunction with the charge on the capacitor, a resultant voltage across said load terminals of the threshold semiconductor device which is above the threshold voltage level thereof, whereby the threshold semiconductor device is momentarily driven to its conducting condition as the capacitor charges to the output of said source of voltage, and output terminals coupled across said capacitor for coupling the signal appearing thereacross to an external circuit.

2. A square wave generator circuit comprising: a series circuit comprising a source of sinusoidal A.C. voltage, a capacitor and bi-directional threshold semiconductor device connected in series circuit relation, said threshold semiconductor device having a pair of load terminals connecting the device into the series circuit, said threshold semiconductor device including a solid state semiconductor material having one condition wherein at least portions thereof between the load terminals are in one condition which is of high resistance and substantially an insulator for blocking the flow of current therethrough in either or both directions when the peak value of an applied voltage is below an upper threshold voltage level, and being driven into another condition wherein said at least portions thereof between the load terminals are in another condition which is of low resistance and substantially a conductor for conducting the flow of current therethrough in either or both directions when the peak value of the applied voltage is raised above said upper threshold voltage level, and reverts to said blocking condition when the current flow therethrough drops to zero, the peak value of said source of voltage being at or above, but less than twice, the upper threshold voltage level of said threshold semiconductor device, said series circuit being devoid of effective current limiting impedances so the time constant of the series circuit is sufficiently short that the capacitor substantially instantaneously charges to the output of said source of voltage as it reaches a value which provides, in conjunction with the charge on the capacitor a resultant voltage across said load terminals of the threshold semiconductor device which is above the threshold voltage level thereof, whereby the threshold semiconductor device is momentarily driven to its conducting condition as the capacitor charges to the output of said source of voltage, the threshold semiconductor device being momentarily so driven to said threshold voltage level once each half cycle of the output of said source of applied voltage and output terminals coupled across said capacitor for coupling the square wave signal appearing thereacross to an external circuit.

3. A generator circuit comprising: a series circuit comprising a source of gradually varying A.C. voltage, a capacitor and a symmetrical bi-directional semiconductor current controlling device including semiconductor material means and two load terminals in non-rectifying contact therewith, means connecting said source of A.C. voltage, capacitor and load terminals of the symmetrical bi-directional semiconductor current controlling device in series circuit relation, said semiconductor material means being of one conducting type, said semiconductor material means including means for providing a first condition of relatively high resistance for substantially blocking A.C. current therethrough between the load terminals substantially equally in both half cycles of the A.C. current, said semiconductor material means including means responsive to an A.C. voltage of at least a threshold value applied to said load terminals for altering said first condition of relatively high resistance of said semiconductor material means for substantially instantaneously providing at least one path through said semiconductor material means beween the load terminals having a second condition of relatively low resistance for conducting the A.C. current therethrough substantially equally in each half cycle of the A.C. current, said semiconductor material means including means for maintaining said at least one path of said semiconductor material means in its said second relatively low resistance conducting condition and providing a substantially constant ratio of voltage change to current change for conducting current at a substantially constant voltage therethrough between the load terminals substantially equally in each half cycle of the A.C. current which voltage is the same for increase and decrease in the instantaneous current above a minimum instantaneous current holding value, and providing a voltage drop across said at least one path in its said second relatively low resistance conducting condition which is a minor fraction of the voltage drop across said semiconductor material means in its said first relatively high resistance blocking condition near said threshold voltage value, and said semiconductor material means including means responsive to a decrease in the instantaneous current, through said at least one path in its said relatively low resistance conducting condition, to a value below said minimum instantaneous current holding value in each half cycle of the A.C. current for immediately causing realtering of said second relatively low resistance conducting condition of said at least one path to said first relatively high resistance blocking condition in each half cycle of the A.C. current for substantially blocking the A.C. current therethrough substantially equally in each half cycle of the A.C. current, the said series circuit being devoid of effective current limiting impedances so the time constant of the series circuit is sufficiently short that the capacitor substantially instantaneously charges to the output of said source of voltage as it reaches a value which provides, in conjunction with the charge on the capacitor, a resultant voltage across said load terminals of the symmetrical bi-directional semiconductor current controlling device which is above the threshold value thereof, whereby said at least one path of the semiconductor material means is momentarily driven to said second low resistance conducting condition as the capacitor charges to the output of said source of voltage.

4. A square wave generator circuit comprising: a series circuit comprising a source of sinusoidal A.C. voltage, a capacitor and a symmetrical bi-directional semiconductor current controlling device including semiconductor material means and two load terminals in non-rectifying contact therewith, means connecting said source of A.C. voltage, capacitor and load terminals of the symmetrical bi-directional semiconductor controlling device in series circuit relation, said semiconductor material means including means for providing a first condition of relatively high resistance for substantially blocking the A.C. current therethrough between the load terminals substantially equally in both half cycles of the A.C. current, said semiconductor material means including means responsive to an A.C. voltage of at least a threshold value applied to said load terminals for altering said first condition of relatively high resistance of said semiconductor material means for substantially instantaneously providing at least one path through said semiconductor material means between the load terminals having a second condition of relatively low resistance for conducting the A.C. current therethrough substantially equally in each half cycle of the A.C. current, the peak value of said source of voltage being at or above, but less than twice, said threshold voltage value of said semiconductor means, said semiconductor material means including means for maintaining said at least one path of said semiconductor material means in its said second relatively low resistance conducting condition and providing a substantially constant ratio of voltage change to current change for conducting current at a substantially constant voltage therethrough between the load terminals substantially equally in each half cycle of the A.C. current which voltage is the same for increase and decrease in the instantaneous current above a minimum instantaneous current holding value, and providing a voltage drop across said at least one path in its said second relatively low resistance conducting condition which is a minor fraction of the voltage drop across said semiconductor material means in its said first relatively high resistance blocking condition near said threshold voltage value, and said semiconductor material means including means responsive to a decrease in the instantaneous current, through said at least one path in its said relatively low resistance conducting condition, to a value below said minimum instantaneous current holding value in each half cycle of the A.C. current for immediately causing realtering of said second relatively low resistance conducting condition of said at least one path to said first relatively high resistance blocking condition in each half cycle of the A.C. current for substantially blocking the A.C. current therethrough substantially equally in each half cycle of the A.C. current, said series circuit being devoid of effective current limiting impedances so the time constant of the series circuit is sufficiently short that the capacitor substantially instantaneously charges to the output of said source of voltage as it reaches a value which provides, in conjunction with the charge on the capacitor, a resultant voltage across said load terminals of the symmetrical bi-directional semiconductor current controlling device which is above the threshold value thereof, whereby said at least one path of the semiconductor material means is momentarily driven to said second low resistance conducting condition as the capacitor charges to the output of said source of voltage.

References Cited

UNITED STATES PATENTS

| | | | |
|---|---|---|---|
| 2,032,439 | 3/1936 | Ruben | 317—237 |
| 2,819,442 | 1/1958 | Goodrich | 307—88.5 |
| 2,865,794 | 12/1958 | Kroger | 317—237 |
| 2,915,648 | 12/1959 | Chudleigh et al. | 307—88.5 |
| 3,056,046 | 9/1962 | Morgan | 307—88.5 |
| 3,064,143 | 11/1962 | Sanderson | 307—88.5 |

ARTHUR GAUSS, *Primary Examiner.*

J. S. HEYMAN, *Assistant Examiner.*